(12) United States Patent
Takano

(10) Patent No.: US 8,143,777 B2
(45) Date of Patent: Mar. 27, 2012

(54) LED LIGHTING UNIT WITH LEDS AND PHOSPHOR MATERIALS

(75) Inventor: Teiichiro Takano, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 816 days.

(21) Appl. No.: 12/198,098

(22) Filed: Aug. 25, 2008

(65) Prior Publication Data

US 2009/0207583 A1    Aug. 20, 2009

(30) Foreign Application Priority Data

Aug. 23, 2007  (JP) ................. 2007-217318
Nov. 13, 2007  (JP) ................. 2007-294459

(51) Int. Cl.
*H01J 1/62*    (2006.01)
*H01J 63/04*   (2006.01)

(52) U.S. Cl. ........ 313/501; 313/498; 313/503; 313/506; 313/512

(58) Field of Classification Search ........... 313/498–512
See application file for complete search history.

(56) References Cited

U.S. PATENT DOCUMENTS

| | | | |
|---|---|---|---|
| 6,686,691 B1 | 2/2004 | Mueller et al. | |
| 6,855,958 B2 | 2/2005 | Sato et al. | |
| 7,520,647 B2 | 4/2009 | Tachibana | |
| 2003/0160255 A1 | 8/2003 | Taninaka et al. | |
| 2006/0126326 A1* | 6/2006 | Ng et al. | 362/231 |
| 2006/0197101 A1 | 9/2006 | Wu | |
| 2007/0247847 A1 | 10/2007 | Villard | |
| 2007/0284563 A1* | 12/2007 | Lee et al. | 257/13 |
| 2008/0303038 A1 | 12/2008 | Grotsch et al. | |
| 2009/0026913 A1* | 1/2009 | Mrakovich | 313/498 |
| 2009/0140630 A1* | 6/2009 | Kijima et al. | 313/498 |
| 2009/0207583 A1 | 8/2009 | Takano | |

FOREIGN PATENT DOCUMENTS

| | | |
|---|---|---|
| JP | 2004-140090 A | 5/2004 |
| JP | 2005-32661 A | 2/2005 |
| JP | 2005-276805 A | 10/2005 |
| JP | 2007-329068 A | 12/2007 |
| JP | 2009-54633 A | 3/2009 |

* cited by examiner

*Primary Examiner* — Karabi Guharay
*Assistant Examiner* — Kevin Quarterman
(74) *Attorney, Agent, or Firm* — Kenealy Vaidya LLP

(57) ABSTRACT

An LED lighting unit can be configured to have a high color rendering for which color temperature can adjust itself to be close to a natural color. The LED lighting unit can be composed of three light sources that respectively include a blue LED and a different phosphor. A first light source can emit light having a color temperature located substantially on a blackbody locus, a second light source can emit light having a higher color temperature than that of the first light source and located substantially on the blackbody locus, and a third light source can emit a green or yellow light. A mixture of the light can be located substantially on the blackbody locus by controlling a beam ratio of the mixed light having contiguous wavelength components. Therefore, the LED lighting unit can emit a light having a high color rendering that can maintain a uniform color within a radiation range.

22 Claims, 12 Drawing Sheets

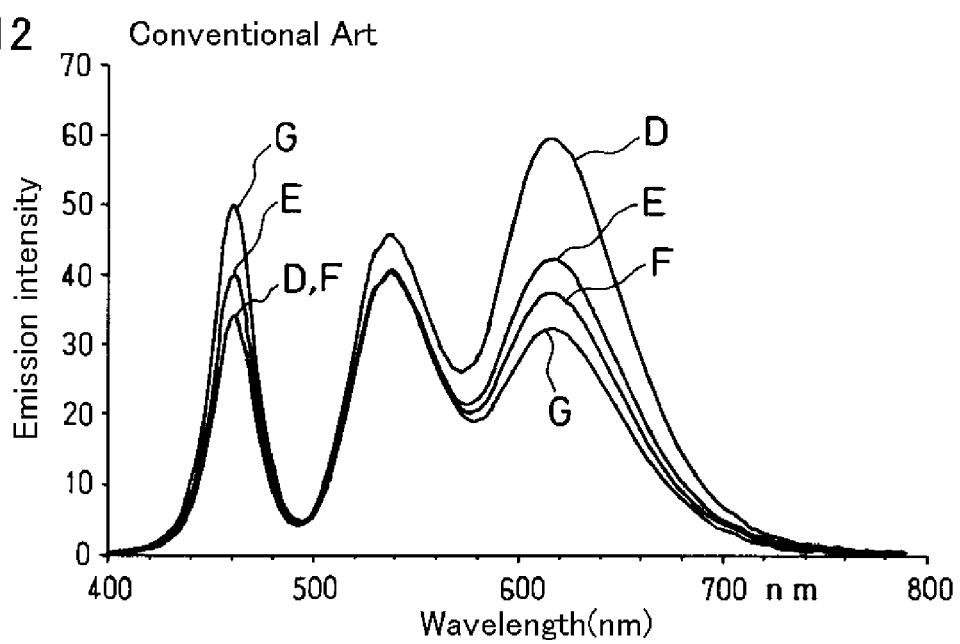

LED LIGHTING UNIT WITH LEDS AND PHOSPHOR MATERIALS

This application claims the priority benefit under 35 U.S.C. §119 of Japanese Patent Application No. 2007-217318 filed on Aug. 23, 2007 and Japanese Patent Application No. 2007-294459 filed on Nov. 13, 2007, both of which are hereby incorporated in their entireties by reference.

BACKGROUND

1. Field

The presently disclosed subject matter relates to LED lighting units, and more particularly to LED lighting units having a high color rendering of which a color temperature can arbitrarily adjust such that it is close to a natural color wherein the lighting unit also has a simple structure.

2. Description of the Related Art

Various LED lighting units that include LEDs as a light source have been developed in recent years. One reason is that LEDs may be a favorable light source with respect to saving energy, environmental problems, etc. In addition, LEDs can emit variously-colored lights while the structure of the LED can be thin and small in size.

A method for emitting white light by using LEDs as a light source will now be described. An LED lighting unit for emitting white light is composed of a red LED, a green LED and a blue LED as a light source. The LED lighting unit can emit white light by additive color mixture in which red, green and blue light of the three additive primary colors are mixed with respect to each other.

A conventional LED lighting unit that emits white light by additive color mixture, for example, is disclosed in Patent Document No. 1 (Japanese Patent Application Laid Open JP2001-184910). An LED lighting unit disclosed in Patent Document No. 1 can emit white light by controlling each beam ratio of red, green and blue lights and mixing their lights with respect to one another.

Specifically, a red LED having both a peak wavelength $\lambda p$ of 605 nm to 635 nm and a half bandwidth $\Delta \lambda$ of 15 nm to 60 nm in emission spectrum, a green LED having both a peak wavelength $\lambda p$ of 530 nm to 570 nm and a half bandwidth $\Delta \lambda$ of 20 nm to 60 nm in emission spectrum and a blue LED having both a peak wavelength $\lambda p$ of 450 nm to 490 nm and a half bandwidth $\Delta \lambda$ of 15 nm to 70 nm in emission spectrum are used as light sources for the LED lighting unit.

In this case, the LED lighting unit can emit various types of white lights having both a correlated color temperature and a general color rendering index by changing each beam ratio of red, green and blue lights. FIG. 11 is a spectrum distribution diagram showing a spectrum of mixed white light made according to the conventional method of additive color mixture.

A white light A shown in FIG. 11 has both correlated color temperature of 6,500 K and general color rendering index Ra of 95.2 by the additive color mixture in which each beam ratio of a red light having both a peak wavelength $\lambda p$ of 620 nm and a half bandwidth $\Delta \lambda$ of 16.1 nm in emission spectrum, a green light having both a peak wavelength $\lambda p$ of 550 nm and a half bandwidth $\Delta \lambda$ of 48.0 nm in emission spectrum, and a blue light having both a peak wavelength $\lambda p$ of 470 nm and a half bandwidth $\Delta \lambda$ of 68.8 nm in emission spectrum, is 20.67, 54.17 and 25.16 percent, respectively.

A white light B shown in FIG. 11 has both correlated color temperature of 5,000 K and general color rendering index Ra of 94.4 by the additive color mixture in which each beam ratio of the red, green and blue lights is 22.88, 57.89 and 19.24 percent, respectively. A white light C shown in FIG. 11 has both correlated color temperature of 3,000 K and general color rendering index Ra of 91.3 by the additive color mixture in which each beam ratio of the red, green and blue lights is 32.12, 59.35 and 8.24 percent, respectively.

Another method for emitting white light by using LEDs as a light source will now be given. Another LED lighting unit for emitting white light is composed of a blue LED as a light source and at least one phosphor for wavelength-converting a part of blue light emitted from the blue LED.

For instance, by using the blue light emitted from the blue LED and red and green lights that are made by converting a wavelength of blue light emitted from the blue LED, the LED lighting unit can emit white light by an additive color mixture in which red, green and blue light of the three additive primary colors are mixed with respect to each other.

When the red light is made by the blue LED and a phosphor, the blue light emitted from the blue LED is converted to a wavelength of red light by exciting a red phosphor with the blue light. Similarly, when the green light is made by the blue LED and a phosphor, a green phosphor is excited by the blue light emitted from the blue LED and the blue light is converted to a wavelength of green light. Thus, the LED lighting unit includes a blue LED as a light source and red and green phosphors for converting the blue light emitted from the blue LED into red and green wavelength light.

Another conventional LED lighting unit that emits white light by the above-described additive color mixture, for example, is disclosed in Patent Document No. 2 (Japanese Patent Application Laid Open JP2002-60747). An LED lighting unit disclosed in Patent Document No. 2 can emit white light by controlling each beam ratio of a blue light emitted from a blue LED and red and green light that is wavelength-converted from the blue light via phosphors and by mixing their light with respect to each another.

Specifically, the LED lighting unit includes a blue LED having a peak wavelength $\lambda p$ of 460 nm and a mixture phosphor including both a red phosphor that is composed of SrS:Eu and a green phosphor that is composed of $SrGa_2S_4$:Eu. The mixture phosphor allows a part of the blue light emitted from the blue LED to convert to red and green light, and therefore the LED lighting unit can emit white light by the additive color mixture in which a non-converted blue light and wavelength-converted red and green light are mixed with respect to each other.

In this case, the LED lighting unit can emit various types of white light having both a correlated color temperature and a general color rendering index by changing each beam ratio of red, green and blue light, such as by controlling a quantity of blue light emitted from the blue LED and each quantity of red and green phosphors, etc. FIG. 12 is a spectrum distribution diagram showing a spectrum of mixed white light made according to the above-described other conventional method of additive color mixture.

For instance, a white light D shown in FIG. 12 has both correlated color temperature of 3,000 K and general color rendering index Ra of 94. Similarly, white lights E, F and G shown in FIG. 12 have both correlated color temperature of 3,800 K, 4,400K and 4,900K and general color rendering index Ra of 94, 94 and 92, respectively.

The above-referenced Patent Documents are listed below.
1. Patent Document No. 1: Japanese Patent Application Laid Open JP2001-184910
2. Patent Document No. 2: Japanese Patent Application Laid Open JP2002-60747

As described above, the method for emitting white light by using red, green and blue LEDs is disclosed in Patent Document No. 1. However, the LED lighting unit disclosed in Patent Document No. 1 may emit all color lights including white light by controlling each beam ratio of red, green and blue light and mixing the different wavelength light with respect to one another.

More specifically, the above-described all color lights means all colors that are located within a triangle of an xy chromaticity diagram in which three apexes are each of light emitted from the red, green and blue LEDs. Vector synthesis of the three single wavelengths can result in emitting all the color lights because the red, green and blue LEDs have spectrum distributions close to the respective single wavelengths.

However, each emission spectrum of red, green and blue light emitted from the LEDs of the above-described LED lighting unit has a narrow half bandwidth, respectively. In addition, each emission spectrum of red, green and blue light cannot maintain a contiguous wavelength area between each emission spectrum thereof due to each separate wavelength component thereof.

Thus, for example, when controlling the white light by an additive color mixture in which red, green and blue light of the three additive primary colors are mixed with respect to each other, and when emitting the mixture light to the outside via a lens, the mixture light may cause each separate area of wavelength components at a contoured part of radiation range because a refractive index of lens varies from each wavelength component of red, green and blue light. Consequently, it may be difficult for the conventional method to maintain a uniform color within the whole radiation range.

To help solve the problem, the LED lighting unit uses an optical mixing structure that may be a relatively complex optical system. In this case, the optical mixing structure may need a large size of LED lighting unit because of each alignment of the LEDs, each long light-path, etc. In addition, when at least one peak wavelength of the emission spectrums of red, green and blue light shifts, the change of noncontiguous wavelength may cause a large fluctuation of general color rendering index Ra in the mixed color light.

Moreover, each beam of red, green and blue light may be small because each integration value of spectrum components of a respective light is small. Especially, each beam of red and blue light having low luminosity factors may extremely decrease with respect to a beam of green light having a high luminosity factor. Thus, it may be difficult for the LED lighting unit to emit brightly due to a low beam of mixed color light.

Likewise, the other method for emitting white light by controlling each beam ratio of a blue light emitted from a blue LED and red and green light that is wavelength-converted from the blue light can have similar problems as referenced with regard to the above-described method.

That is to say, because the blue light emitted from the blue LED and the red and green light that is wavelength-converted from the blue light are mixed with respect to each other, the mixture light emitted to the outside via a lens may cause separation of each area of the wavelength components at a contoured part of a radiation range because a refractive index of lens varies from each wavelength component of red, green and blue light. Thus, the other method may also be difficult to maintain a uniform color within the whole radiation range.

In addition, the other method may be difficult to control peak wavelengths of emission spectrum of red and green light within a normal range of variation via the mixture phosphor. When a peak wavelength of blue light emitted from the blue LED shifts, all the peak wavelengths of light shift and therefore the changes of wavelengths may cause a fluctuation of general color rendering index Ra in the mixed color light.

The disclosed subject matter has been devised to consider the above and other problems and characteristics. Thus, embodiments of the disclosed subject matter can include LED lighting units having a high brightness and a high color rendering that can maintain a uniform color within the whole radiation range.

Furthermore, the disclosed subject matter can also include an LED lighting unit of which a color temperature of emission color is configured to arbitrarily adjust close to a natural color such as sunlight, and can reduce or change associated problems and characteristics of the conventional lighting units and methods.

SUMMARY

The presently disclosed subject matter has been devised in view of the above and other problems and characteristics. An aspect of the disclosed subject matter includes LED lighting units that can emit various color lights including white light.

According to another aspect of the disclosed subject matter, an LED lighting unit can include: a first light source including a blue LED and a mixture phosphor for wavelength-converting a part of blue lights emitted from the blue LED to wavelengths of red and green lights, the mixture phosphor be configured to emit the wavelength of red light more than the wavelength of green light; a second light source including a blue LED and a mixture phosphor for wavelength-converting a part of blue lights emitted from the blue LED to wavelengths of red and green lights, the mixture phosphor be configured to emit the wavelength of green light more than the wavelength of red light; and a third light source including a blue LED and a phosphor for wavelength-converting a part of blue lights emitted from the blue LED to a wavelength of green light or a phosphor for wavelength-converting a part of blue lights emitted from the blue LED to a wavelength of yellow light. The first light source can emit a light having a color temperature located on substantially blackbody locus, the second light source can emit a light having a higher color temperature on substantially blackbody locus than the color temperature of light emitted from the first light source and the third light source can emit a light that is located within a green color area or a yellow color area in xy chromaticity diagram. In addition, a lens can locate towards a direction of light-emission of the lights emitted from the first light source, the second light source and the third light source, and the lens can be configured to control a mixture light of their lights.

In the above described exemplary LED lighting unit, the LED lighting unit can further include: a first power supply for controlling a driving current of the first light source; a second power supply for controlling a driving current of the second light source; and a third power supply for controlling a driving current of the third light source. Both the first power supply and the second power supply can control the beam ratio of the light emitted from the first light source to the light emitted from the second light source and the third power supply can control the beam ratio of the light emitted from the third light source to both the light emitted from the first light source and the light emitted from the second light source According to the above-described exemplary LED lighting unit, the LED lighting unit can have the mixture light located on substantially blackbody locus by controlling each beam ratio of the above-described three lights having contiguous wavelength components. Therefore, the LED lighting unit can emit a light having a high color rendering that can maintain a uniform color within a radiation range and also a color temperature thereof can arbitrarily be adjusted a close light to a natural color like sunlight with a simple structure.

According to another aspect of the disclosed subject matter, an LED lighting unit can include: a first light source including a blue LED and a mixture phosphor for wavelength-converting a part of blue lights emitted from the blue LED to wavelengths of red and green lights, the mixture phosphor be configured to emit the wavelength of red light more than the wavelength of green light; a first power supply for controlling a driving current of the first light source; a second light source including a blue LED and a mixture phosphor for wavelength-converting a part of blue lights emitted from the blue LED to wavelengths of red and green lights, the mixture phosphor be configured to emit the wavelength of green light more than the wavelength of red light; a second power supply for controlling a driving current of the second light source; a third light source including a blue LED and a phosphor for wavelength-converting a part of blue lights emitted from the blue LED to a wavelength of green light or a phosphor for wavelength-converting a part of blue lights emitted from the blue LED to a wavelength of yellow light; a third power supply for controlling a driving current of the third light source; and a lens located towards a direction of light-emission of lights emitted from the first light source, the second light source and the third light source, and the lens be configured to control a mixture light of the three lights. Moreover, both the first power supply and the second power supply can control the beam ratio of the light emitted from the first light source to the light emitted from the second light source and the third power supply can control the beam ratio of the light emitted from the third light source to both the light emitted from the first light source and the light emitted from the second light source.

In the above-described exemplary LED lighting unit, the LED lighting unit can emit various color lights that are located within a triangle of xy chromaticity diagram in which three apexes are each of their lights emitted from the first light source, the second light source and the third light source by controlling each beam ratio of the three lights having contiguous wavelength components.

BRIEF DESCRIPTION OF THE DRAWINGS

These and other characteristics and features of the disclosed subject matter will become clear from the following description with reference to the accompanying drawings, wherein:

FIG. 12 is a spectrum distribution diagram showing a spectrum of mixed white light according to another conventional method of additive color mixture.

DETAILED DESCRIPTION OF EXEMPLARY EMBODIMENTS

Figure 1:
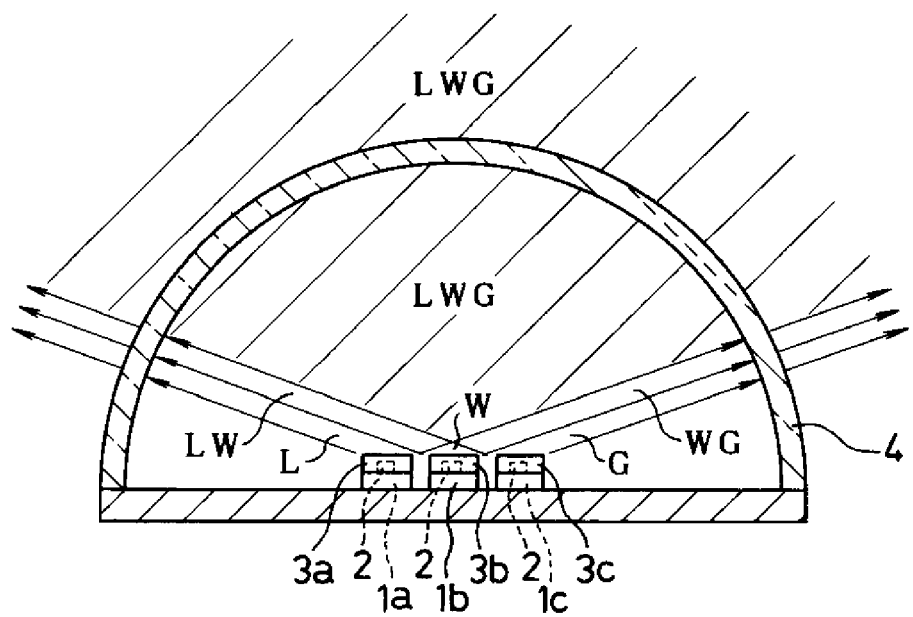
FIG. 1 is a side cross-section summary view showing a structure for a first exemplary embodiment of an LED lighting unit made in accordance with principles of the disclosed subject matter.

The first exemplary embodiment of the disclosed subject matter will now be described in detail with reference to FIGS. 1 to 6. FIG. 1 is a cross-sectional summary view showing a structure for a first exemplary embodiment of an LED lighting unit made in accordance with principles of the disclosed subject matter.

The LED lighting unit can include a first light source 1a, a second light source 1b and a third light source 1c, of which spectrum distributions are respectively different. Each of the light sources 1a, 1b and 1c can be configured with a blue LED emitting a blue light having a peak wavelength of 450 nm to 480 nm. In addition, each of the light sources 1a, 1b and 1c can include phosphors 3a, 3b and 3c, respectively, and can be configured to emit a different color light from the blue light by exciting each of the phosphors 3a, 3b and 3c with the blue light.

The phosphor 3a can include both a red phosphor emitting a red light that is wavelength-converted by exciting the red phosphor with the blue light and a green phosphor emitting a green light that is wavelength-converted by exciting the green phosphor with the blue light. The mixture ratio of the red phosphor to the green phosphor can be configured to emit more red light than green light.

The phosphor 3b can also include both a red phosphor for emitting a wavelength-converted red light and a green phosphor for emitting a wavelength-converted green light. However, the mixture ratio of the red phosphor to the green phosphor can be configured to emit more green light than red light. The phosphor 3c can include a green phosphor for emitting a wavelength-converted green light.

The above-described red phosphor can include SrS:Eu and the like, and the green phosphor can include $SrGa_2S_4$:Eu, etc. Therefore, each of the light sources 1a, 1b and 1c can emit light L, W and G described later in detail, respectively. In addition, a lens 4 can be located in a direction of light-emission of the lights L, W and G in order to control a light distribution of mixture light LWG which is mixed light by additive color mixture. The lights L, W and G and the mixture light LWG will now be described in more detail in turn.

The light L emitted from the first light source 1a can include both the blue light emitted from the blue LED 2 and a light wavelength-converted by exciting the phosphor 3a with a part of the blue light emitted from the blue LED 2.

Thus, the light L can have a different spectrum distribution from that of the blue light emitted from the blue LED 2.

Figure 2:
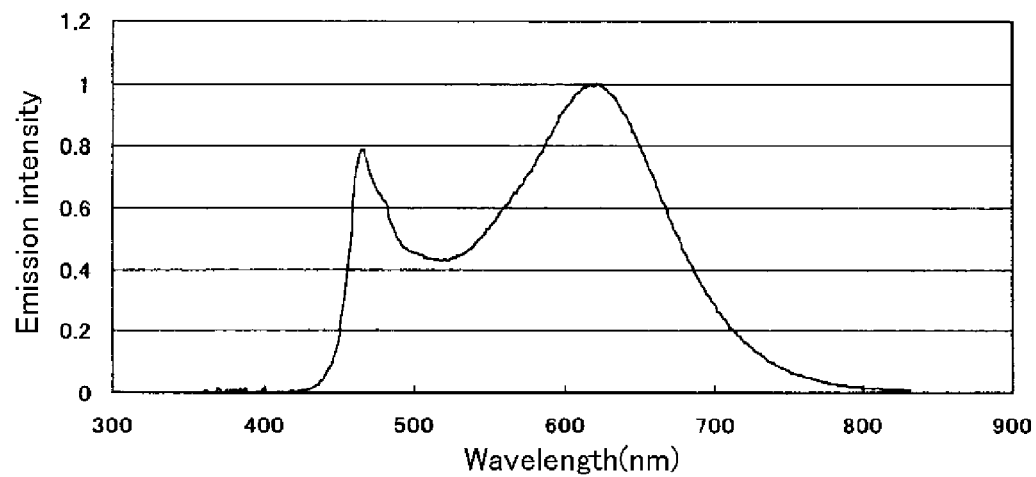
FIG. 2 is a spectrum distribution diagram showing a spectrum of light L emitted from a first light source 1a of the LED lighting unit shown in FIG. 1.

FIG. 2 is a spectrum distribution diagram showing a spectrum of the light L emitted from the first light source 1a. The light L can include a contiguous wavelength component of approximately 420 nm to 830 and can maintain an emission intensity of more than 20 percent of maximum emission intensity within a broad range of around 450 nm to 710 nm, as shown in FIG. 2.

In addition, the light L can have a high color rendering index that is close to that of a typical bulb color having a color temperature of 2,800 K on a color temperature coordinate. The reasons are that the first light source 1a includes both the blue LED 2 and the phosphor 3a, which includes both the red phosphor for converting a blue light to a wavelength of red light and the green phosphor for converting a blue light to a wavelength of green light. The mixture ratio of the red phosphor and the green phosphor can be configured to emit more red wavelength light than green wavelength light.

The light W that is emitted from the second light source 1b can also include both blue light emitted from the blue LED 2 and a light that is wavelength-converted by exciting phosphor 3b with a part of the blue light emitted from the blue LED 2. Thus, the light W can also have a different spectrum distribution from that of the blue light emitted from the blue LED 2.

Figure 3:
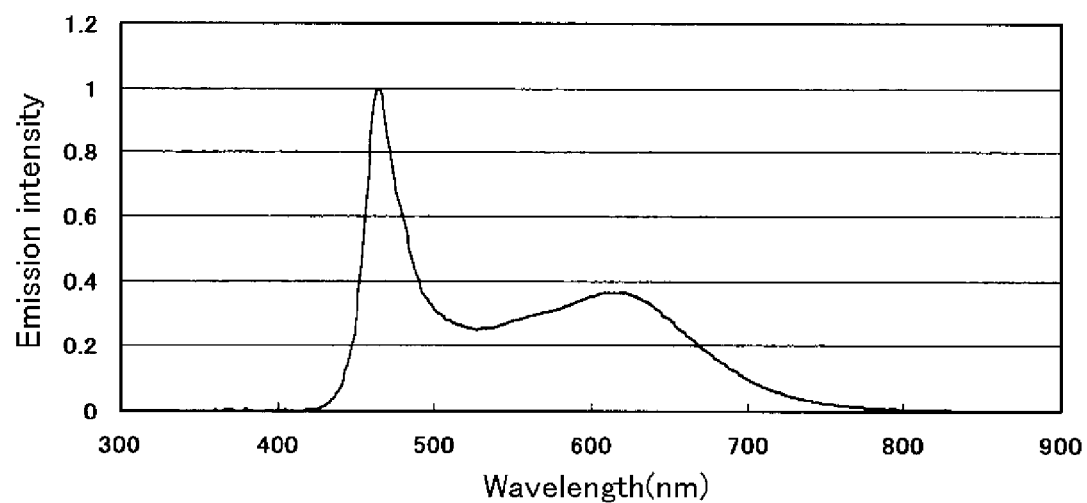
FIG. 3 is a spectrum distribution diagram showing a spectrum of light W emitted from a second light source 1b of the LED lighting unit shown in FIG. 1.

FIG. 3 is a spectrum distribution diagram showing a spectrum of the light W emitted from the second light source 1b. The light W can include a contiguous wavelength component of approximately 420 nm to 800 and can maintain an emission intensity of more than 20 percent of maximum emission intensity within a broad range of around 450 nm to 660 nm, as shown in FIG. 3.

In addition, the light W can have a high color rendering index that is close to that of a white color tone corresponding to a color temperature of 7,000 K on a color temperature coordinate. The reasons are that the second light source 1b includes both the blue LED 2 and the phosphor 3b, which includes both the red phosphor for converting blue light to red light and the green phosphor for converting blue light to green light. The mixture ratio of the red phosphor and the green phosphor is configured to emit more green light than red light.

Furthermore, the light G emitted from the third light source 1c can also include both the blue light emitted from the blue LED 2 and light that is wavelength-converted by exciting the phosphor 3c with part of the blue light emitted from the blue LED 2. Thus, the light G can also have a different spectrum distribution from that of the blue light emitted from the blue LED 2.

Figure 4:
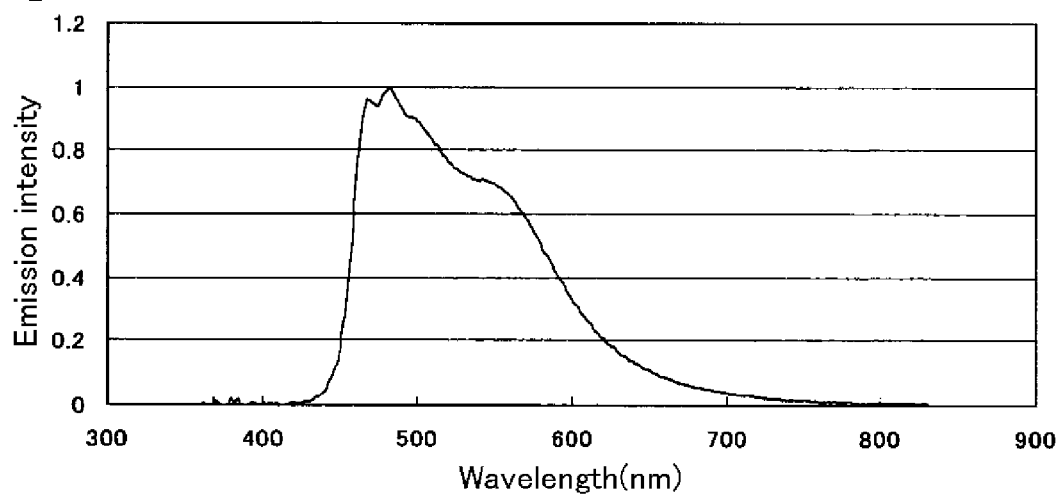
FIG. 4 is a spectrum distribution diagram showing a spectrum of light G emitted from a third light source 1c of the LED lighting unit shown in FIG. 1.

FIG. 4 is a spectrum distribution diagram showing a spectrum of the light G emitted from the third light source 1c. The light G can include a contiguous wavelength component of approximately 420 nm to 780 and can maintain an emission intensity that is more than 20 percent of a maximum emission intensity and within a wide range of around 450 nm to 620 nm, as shown in FIG. 4.

The light G can have a green color tone in an xy chromaticity diagram, in which the x value is approximately 0.276 and the y value is around 0.423. The reasons are that the third light source 1c includes both the blue LED 2 and phosphor 3c, which includes the green phosphor for converting blue light to green light by exciting the phosphor with the blue light.

Figure 5:
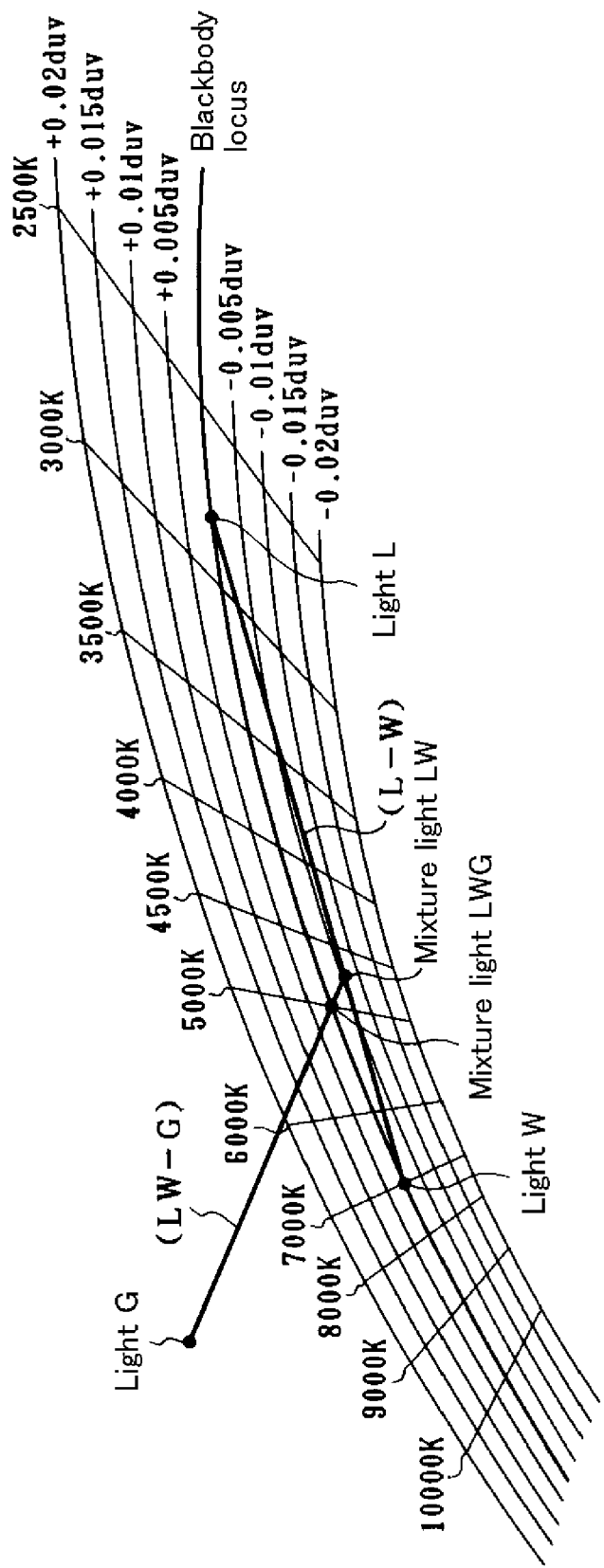
FIG. 5 is a uv chromaticity diagram showing a relation between the lights L, W and G and a mixture light LWG mixed by the light sources 1a, 1b and 1c of the LED lighting unit shown in FIG. 1 along with blackbody locus.

The above-described lights L, W and G can maintain an emission intensity of more than 20 percent of a maximum emission intensity and within a wavelength range of at least around 450 nm to 600 nm. FIG. 5 is a uv chromaticity diagram showing a relation between the lights L, W and G and a mixture light LWG mixed with the light emitted from the light sources 1a, 1b and 1c of the LED lighting unit, along with blackbody locus.

As shown in FIG. 5, both the light L having color temperature of 2,800 K and the light W having color temperature of 7,000K can be located on substantially blackbody locus. However, the light G having an x value of approximately 0.276 and a y value of around 0.423 in xy chromaticity diagram can be located outside of the blackbody locus in the uv chromaticity diagram.

According to the disclosed subject matter, the mixture light LWG of the above-described lights L, W and G can be used for an LED lighting unit without an adjustment in some applications. However, the LED light unit can emit various color lights that are located within a triangle of xy chromatic coordinate in which three apexes are the lights L, W and G by changing the beam ratio of the lights L, W and G emitted from the respective light sources 1a, 1b and 1c.

Because the additive color mixture light LWG of the lights L, W and G can continuously be moved on blackbody locus by changing each beam ratio between the lights L, W and G, the LED lighting unit can emit a light that is close to a natural color, such as sunlight. A method for continuously moving the mixture light LWG on the blackbody locus will now be described in detail with reference to FIG. 5.

The LED light unit can include a first power supply for controlling a driving current of the blue LED 2 of the first light source 1a, a second power supply for controlling a driving current of the blue LED 2 of the second light source 1b and a third power supply for controlling a driving current of the blue LED 2 of the third light source 1c.

The beam ration of the light L to the light W can be changed by controlling each driving current of the blue LEDs 2 of the light sources 1a and 1b. When changing the beam ratio of the light L to the light W, an additive color mixture light LW of both the lights L and W can move on a line L-W, which connects the light L to the light W in the uv chromaticity diagram.

More specifically, when supplying only the first light source 1a with the driving current, the mixture light LW can be emitted at a color temperature of 2,800 K on the blackbody locus, because the first light source 1a can emit the light L at a color temperature of 2,800 K on blackbody locus but the second light source 1b cannot emit the light W without the driving current.

Then, if the driving current of the second light source 1b is gradually increased by the second power supply while the driving current of the first light source 1a is gradually decreased by the first power supply, the beam ratio of the light W to the light L can gradually increase from zero percent and therefore the mixture light LW can move on the line L-W toward the light W in the uv chromaticity diagram.

Finally, when supplying only the second light source 1b with the driving current and not supplying the first light source 1a with a drive current, the mixture light LW can be emitted at a color temperature of 7,000 K in blackbody locus. This is because the second light source 1b can emit light W at a color temperature of 7,000 K on the blackbody locus, but the first light source 1a cannot emit light L because the driving current is not supplied thereto.

In this case, the line L-W on which the mixture light LW moves may be different from the blackbody locus. However, the line L-W can be located near the blackbody locus. In addition, the beam ration of the light G to the mixture light LW can be changed by controlling a driving current of the blue LED 2 of the third light source 1c.

Moreover, when changing the beam ratio of the light G to the mixture light LW, the additive color mixture light LWG of both the light G and the mixture light LW can move on a line LW-G, which connects the light G to the mixture light LW in the uv chromaticity diagram. Thus, the mixture light LWG can be located at the intersection of the line LW-G and blackbody locus by controlling the driving current of the blue LED 2 of the third light source 1c.

More specifically, when supplying only both the light sources 1a and 1b with driving currents while maintaining the predetermined beam ratio of the light L to the light W, the mixture light LW can be emitted on the line L-W in the uv chromaticity diagram, because the third light source 1c cannot emit the light G without the driving current.

Then, if the driving current of the third light source 1c is gradually increased by the third power supply while maintaining the predetermined beam ratio of the light L to the light W, the beam ratio of the light G to the mixture light LW can gradually increase from zero percent. Therefore the mixture light LWG can move on the line LW-G toward the light G in the uv chromaticity diagram.

Thus, the mixture light LWG can be located at the intersection of the line LW-G and the blackbody locus by controlling the driving current of the blue LED 2 of the third light source 1c. In this case, if the driving currents of both the light sources 1a and 1b are gradually decreased while maintaining the predetermined beam ratios of both the light L to the light W and the light G to the mixture light LW, the mixture light LWG can move on the line LW-G toward the light G in the uv chromaticity diagram.

Finally, when supplying only the third light source 1c with the driving current and when both the light sources 1a and 1b are not supplied with drive currents, the mixture light LWG can be emitted at the light G having an x value of approximately 0.276 and y value of around 0.423 in the xy chromaticity diagram.

Thus, the LED light unit of this embodiment of the disclosed subject matter can provide all color lights that are located within a triangle of chromatic coordinate in which three apexes of color lights are formed by the first light source 1a, the second light source 1b and the third light source 1c. In addition, because the above-described mixture light LWG can be emitted on a blackbody locus within the range between the light L to the light W, the LED light unit can enjoy a natural light such as sunlight.

Results of an exemplary experiment using the LED lighting unit are shown in the following table 1, in which a relation between color temperature and both general color rendering index Ra and conversion efficiency shows when the mixture light LWG moves on the blackbody locus of 2,800 K to 7,000K in the uv chromatic coordinate, as shown in FIG. 5.

TABLE 1

| Color temperature (K) | General color rendering index Ra | Conversion efficiency (lm/W) |
|---|---|---|
| 2,800 | 92 | 34 |
| 3,000 | 92 | 34 |
| 4,000 | 92 | 34 |
| 5,000 | 92 | 34 |
| 6,000 | 92 | 34 |
| 7,000 | 92 | 34 |

The general color rendering index Ra of the mixture light LWG can be 92 at each color temperature from 2,800K to 7,000K. In addition, the conversion efficiency can be 341 m/W for each of the color temperature values from 2,800K to 7,000K, as shown in Table 1. Thus, the LED lighting unit can have both a high and stable general color rendering index Ra and favorable conversion efficiency even when an emission color thereof continuously changes.

Figure 6:
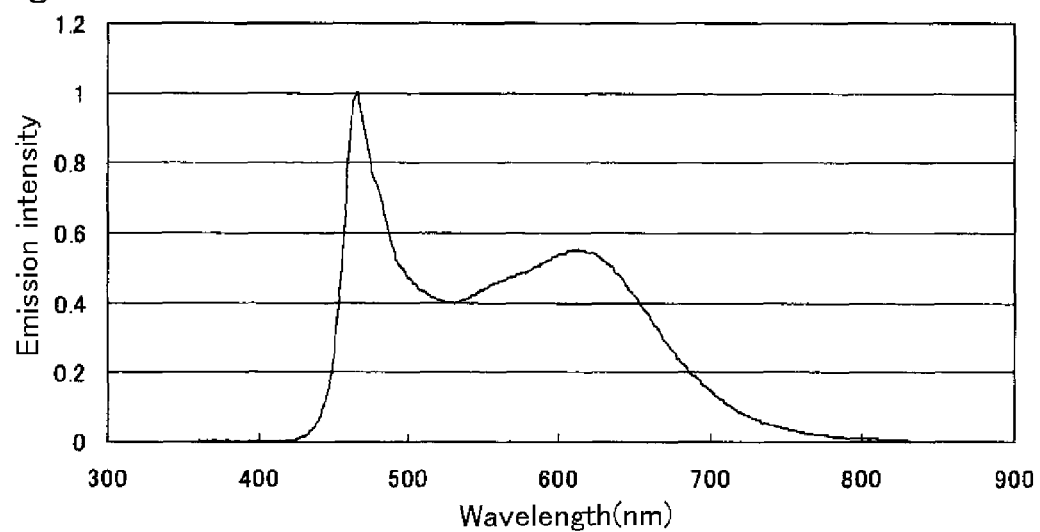
FIG. 6 is a spectrum distribution diagram showing a spectrum of the mixture light LWG having color temperature of 5,000 K in the LED lighting unit shown in FIG. 1.

FIG. 6 is a spectrum distribution diagram showing a spectrum of the mixture light LWG having color temperature of 5,000 K. The mixture light LWG can include a contiguous wavelength component of approximately 420 nm to 830 nm and can maintain an emission intensity of more than 20 percent of a maximum emission intensity within a broad range of around 450 nm to 690 nm, as shown in FIG. 6. Thus, the LED lighting unit can emit white light having both a high color rendering index and high emission efficiency.

As described above, the LED lighting unit can emit the mixture light LWG having a predetermined color temperature from the outside via the lens 4. In this case, because the mixture light LWG can maintain an emission intensity of more than 20 percent of a maximum emission intensity and within a broad range of around 450 nm to 690 nm, the mixture light LWG may not cause each separate area of wavelength component to be discernable at contoured parts of a radiation range. Thus, the LED light unit can emit a uniform color light within the whole radiation range.

When the mixture light LWG is emitted via lens 4 and focused to the outside, because the mixture light LWG does not generate separate color light within the radiation range, the LED lighting unit can favorably be used as a spot light. In addition, the spot light can be structured with a thin and small size because of the ability to focus the mixture light LWG with a simple optical structure.

Furthermore, because the mixture light LWG can include large integration values of red and blue light having low luminosity factors in a spectrum thereof, as shown in FIG. 6, the mixture light LWG can be large and bright and configured for use as a light source for the LED lighting unit. Thus, the mixture light LWG can result in LED lighting units having a high brightness and a favorable light distribution.

It is ideal to locate both of the lights L and W on the blackbody locus in order to locate the mixture light LWG on blackbody locus. However, a difference between both of the lights L and W and the blackbody locus can be within a range, for example, from −0.002 duv to +0.002 duv, or from −0.005 duv to +0.005 duv, in order to reduce the driving current of the third light source 1c.

The light G can have a green color tone in the xy chromaticity diagram, in which the x value is approximately 0.276 and the y value is around 0.423 as described above. However, the light G should not be limited to these xy values, and can be located within a green area in the xy chromaticity diagram in which the line LW-W can intersect with blackbody locus.

The above-described first exemplary embodiment can be useful with respect to the mixture light LWG having color temperature of 2,800K to 7,000K on the blackbody locus. However, the mixture light LWG may not be efficiently emitted at a color temperature of less than 2,800K. Thus, the LED lighting unit using the mixture light LWG may have difficulty in some cases emitting a light such as a candlelight having color temperature of around 2,000K, a sunlight at sunup and sundown having color temperature of approximately 2,500K, etc.

Figure 7:
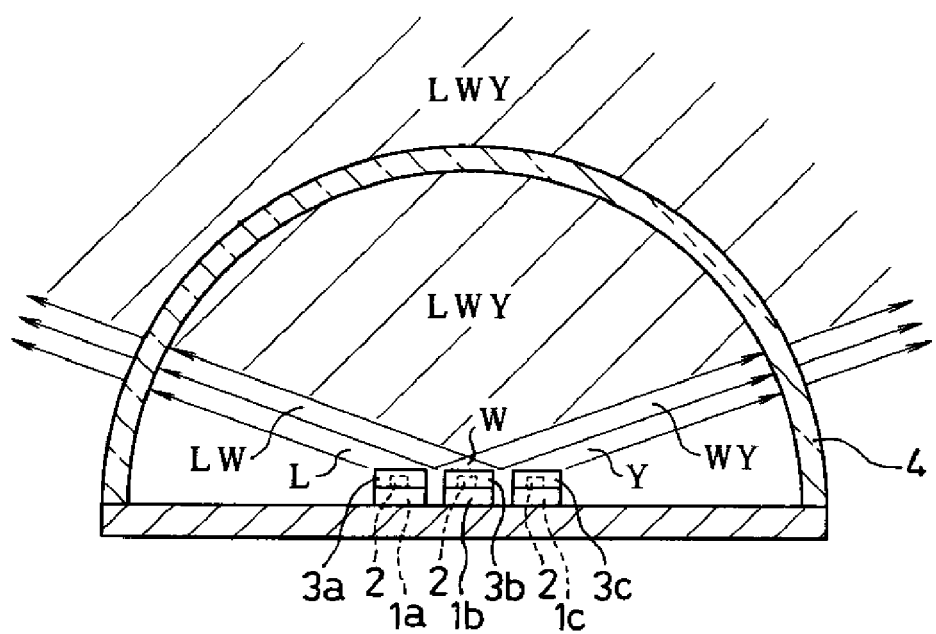
FIG. 7 is a side cross-section summary view showing a structure for a second exemplary embodiment of an LED lighting unit made in accordance with principles of the disclosed subject matter.

A second exemplary embodiment of the disclosed subject matter will now be given with reference to FIGS. 7 to 10. A structure for the second exemplary embodiment of an LED lighting unit is shown in FIG. 7, wherein the same or similar elements shown in FIG. 1 are referenced by same reference numerals. The LED lighting unit can be similar to the LED lighting unit shown in FIG. 1. Differences between the LED lighting unit shown in FIG. 7 and the LED lighting unit shown in FIG. 1 can be the phosphor 3a of the first light source 1a and the phosphor 3c of the third light source.

The phosphor 3a of the second exemplary embodiment can also include both a red phosphor for converting a blue light to a red wavelength light by exciting the phosphor with the blue light, and a green phosphor for converting a blue light to a green wavelength light by exciting the phosphor with the blue light. However, the mixture ratio of the red phosphor to the green phosphor can be configured to emit more red light in the second exemplary embodiment than green light as compared to the first exemplary embodiment.

Figure 8:
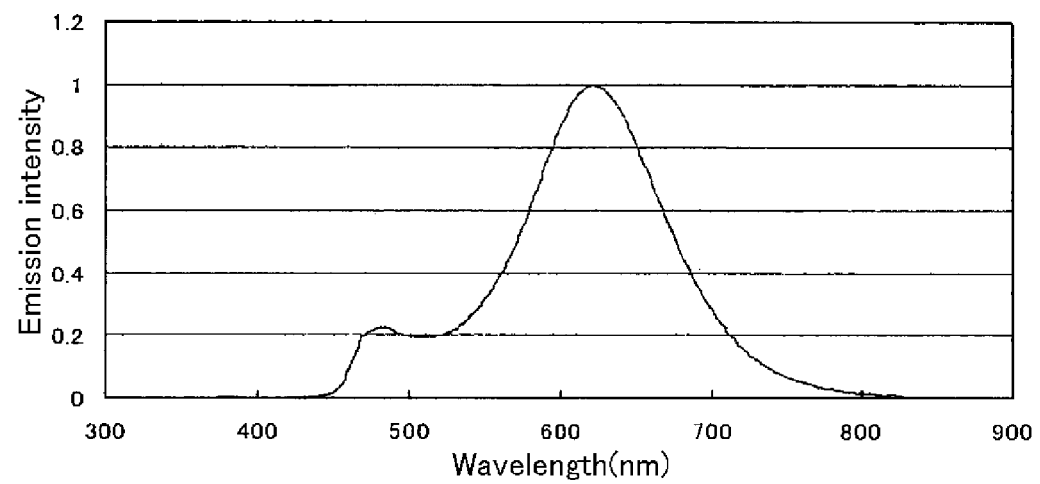
FIG. 8 is a spectrum distribution diagram showing a spectrum of a light L emitted from a first light source 1a of the LED lighting unit shown in FIG. 7.

FIG. 8 is a spectrum distribution diagram showing a spectrum of the light L emitted from the first light source 1a of the second exemplary embodiment. The light L can include a contiguous wavelength component of approximately 450 nm to 830 and can maintain emission intensity to be more than 20 percent of a maximum emission intensity and within a broad range of around 470 nm to 710 nm as shown in FIG. 8.

Therefore, the light L can have a high color rendering index that is close to that of a color tone of candlelight having a color temperature of 2,000 K on a color temperature coordinate. The reasons are that the first light source 1a includes both the blue LED 2 and the phosphor 3a, which includes both a red phosphor for converting blue light to a red wavelength light and a green phosphor for converting blue light to a green wavelength light. The mixture ratio can be configured to emit more red wavelength light in the second exemplary embodiment as compared to green wavelength light as in the first exemplary embodiment.

On the other hand, the phosphor 3c used in the second exemplary embodiment can include a yellow phosphor for converting blue light to a yellow wavelength light by exciting the phosphor with the blue light, unlike that in the first exemplary embodiment. Thus, the light Y emitted from the third light source 1c can include both a part of blue light emitted from the blue LED 2 and yellow light wavelength-converted by exciting the phosphor 3c with the blue light emitted from the blue LED 2.

Figure 9:
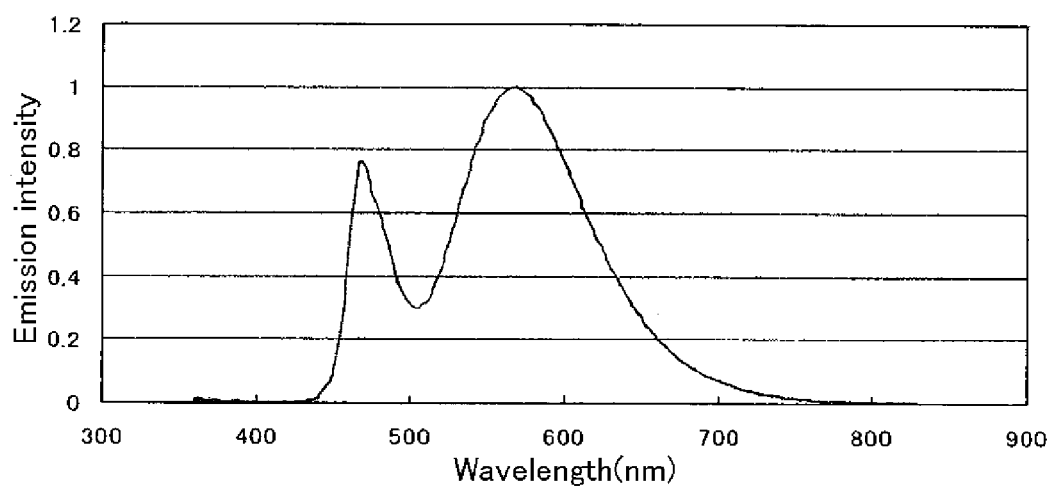
FIG. 9 is a spectrum distribution diagram showing a spectrum of a light Y emitted from a third light source 1c of the LED lighting unit shown in FIG. 7.

FIG. 9 is a spectrum distribution diagram showing a spectrum of the light Y emitted from the third light source 1c. The light Y can include a contiguous wavelength component of approximately 450 nm to 800 and can maintain an emission intensity of more than 20 percent of a maximum emission intensity and within a wide range of around 460 nm to 660 nm as shown in FIG. 9.

The light Y can have a yellow color tone in an xy chromaticity diagram, in which the x value is within a range of from approximately 0.35 to 0.45 and the y value is within a range of from around 0.4 to 0.5. The reasons are that the third light source 1c includes both the blue LED 2 and the phosphor 3c, which includes the yellow phosphor for converting blue light to a yellow wavelength light by exciting the phosphor with the blue light.

Figure 10:
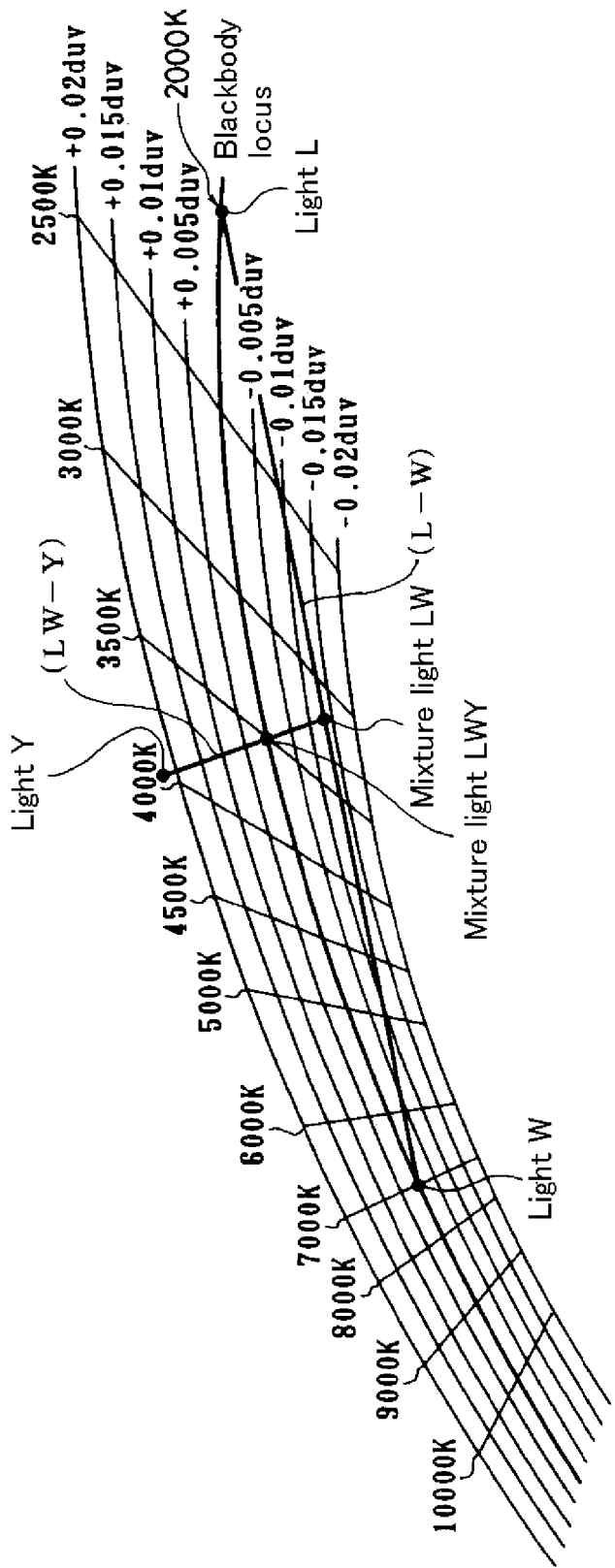
FIG. 10 is a uv chromaticity diagram showing a relation between the lights L, W and Y and a mixture light LWY mixed by the light sources 1a, 1b and 1c of the LED lighting unit shown in FIG. 7 along with blackbody locus.
Figure 11:
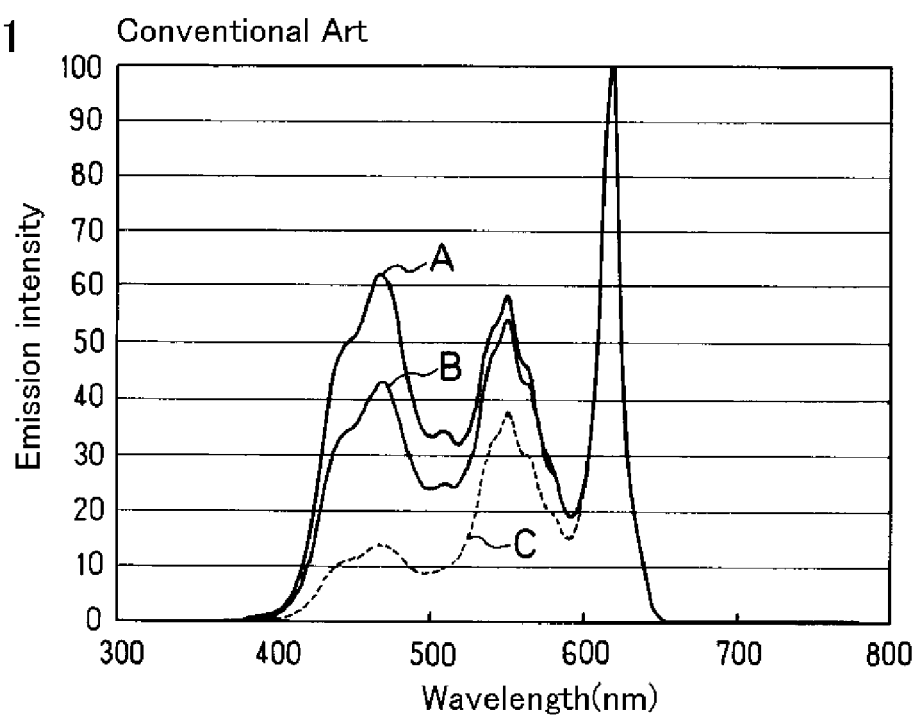
FIG. 11 is a spectrum distribution diagram showing a spectrum of mixed white light according to a conventional method of additive color mixture.

FIG. 10 is a uv chromaticity diagram showing a relation between the lights L, W and Y and a mixture light LWY mixed by the light sources 1a, 1b and 1c along with a blackbody locus. Both the light L having a color temperature of 2,000 K and the light W having a color temperature of 7,000K can be located substantially on the blackbody locus. However, the light Y having an x value of approximately 0.35 to 0.45 and a y value of around 0.4 to 0.5 in the xy chromaticity diagram can be located outside of the blackbody locus in the uv chromaticity diagram.

The additive color mixture light LWY of the lights L, W and Y can also be moved on the blackbody locus by changing each beam ratio between the lights L, W and Y as described above in the first exemplary embodiment.

Results of an exemplary experiment using the mixture light LWY are shown in the following table 2, in which a relation between color temperature and both general color rendering index Ra and conversion efficiency shows the mixture light LWY moving on the blackbody locus of 2,000 K to 7,000K in the uv chromatic coordinate as shown in FIG. 10.

TABLE 2

| Color temperature (K) | General color rendering index Ra | Conversion efficiency (lm/W) |
|---|---|---|
| 2,000 | 92 | 34 |
| 2,500 | 92 | 34 |
| 3,000 | 92 | 34 |
| 4,000 | 92 | 34 |
| 5,000 | 92 | 34 |
| 6,000 | 92 | 34 |
| 7,000 | 92 | 34 |

A general color rendering index Ra of the mixture light LWG can all be 92 at each color temperature from 2,000K to 7,000K. Also, the conversion efficiency can all be 341 m/W as shown in Table 2. Thus, the disclosed subject matter can provide LED lighting units having both a high and stable general color rendering index Ra and favorable conversion efficiency even when an emission color thereof continuously changes from 2,000K to 7,000K.

Because the mixture light LWY in the second exemplary embodiment can also maintain an emission intensity of more than 20 percent of a maximum emission intensity within a broad range from around 470 nm to 700 nm, the mixture light LWY should not cause separation at each area of wavelength components at contoured parts of a radiation range.

Thus, the disclosed subject matter can provide an LED lighting unit having a high color rendering that can maintain a uniform color within the whole radiation range. In addition, the color temperature can arbitrarily be adjusted to be close to a natural color between 2,000K and 7,000K on blackbody locus.

In the above-described embodiments, each number of the light sources 1a, 1b and 1c is described as one light source and the number of LED therein is also described as one LED. However, their numbers should not be limited to one light source or one LED. The number can be determined according to a particular usage, purpose, application, etc. In addition, the lens 4 is described and depicted as covering all the light sources with one lens. However, a plurality of lenses can be used so as to cover each of the light sources or so as to separately cover a plurality of light sources without departing from the spirit and scope of the presently disclosed subject matter.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. An LED lighting unit comprising:
 a first light source including a blue LED configured to emit blue light and a phosphor material configured to wavelength-convert at least a part of the blue light emitted from the blue LED to red wavelength light and green wavelength light, the phosphor material configured to emit more red wavelength light than green wavelength light, and the first light source configured to emit light having a color temperature located substantially on a blackbody locus;

a second light source including a blue LED configured to emit blue light and a second phosphor material configured to wavelength-convert at least a part of the blue light emitted from the blue LED to red wavelength light and green wavelength light, the second phosphor material configured to emit more green wavelength light than red wavelength light, and the second light source configured to emit light having a higher color temperature substantially on the blackbody locus than a color temperature of light emitted from the first light source;

a third light source including a blue LED configured to emit blue light and a third phosphor material configured to wavelength-convert at least a part of the blue light emitted from the blue LED to at least one of a green wavelength light and a yellow wavelength light, and the third light source configured to emit light located within at least one of a green color area and a yellow color area in an xy chromaticity diagram; and a lens located in a direction of light-emission of light emitted from the first light source, the second light source and the third light source, and the lens being configured to control a mixture of the light emitted from the first light source, the second light source and the third light source, wherein the light emitted from each of the first light source, the second light source and the third light source maintains an emission intensity of more than 20 percent of a maximum emission intensity of a respective one of the first light source, the second light source and the third light source when emitting light within a wavelength range of at least from 470 nm to 600 nm.

2. The LED lighting unit according to claim 1, wherein the light emitted from the first light source has a color temperature of substantially 2,800 K, the light emitted from the second light source has a color temperature of substantially 7,000 K, and the light emitted from the third light source is located within a green color area in the xy chromaticity diagram.

3. The LED lighting unit according to claim 2, wherein the light emitted from each of the first light source, the second light source and the third light source maintains an emission intensity of more than 20 percent of a maximum emission intensity of a respective one of the first light source, the second light source and the third light source when emitting light within a wavelength range of from 450 nm to 600 nm.

4. The LED light unit according to claim 1, wherein the light emitted from the first light source has a color temperature of substantially 2,000 K, the light emitted from the second light source has a color temperature of substantially 7,000 K, and the light emitted from the third light source is located within a green color area in the xy chromaticity diagram.

5. The LED lighting unit according to claim 4, wherein the light emitted from each of the first light source, the second light source and the third light source maintains an emission intensity of more than 20 percent of a maximum emission intensity of a respective one of the first light source, the second light source, and the third light source when emitting light within a wavelength range of from 470 nm to 660 nm.

6. The LED lighting unit according to claim 1, further comprising:

a first power supply for controlling a driving current to the first light source, a second power supply for controlling a driving current to the second light source, and a third power supply for controlling a driving current to the third light source, wherein both the first power supply and the second power supply control a beam ratio of light emitted from the first light source to light emitted from the second light source, and the third power supply controls a beam ratio of light emitted from the third light source to both light emitted from the first light source and light emitted from the second light source.

7. The LED lighting unit according to claim 2, further comprising:

a first power supply for controlling a driving current to the first light source, a second power supply for controlling a driving current to the second light source and a third power supply for controlling a driving current to the third light source, wherein both the first power supply and the second power supply control a beam ratio of light emitted from the first light source to light emitted from the second light source, and the third power supply controls a beam ratio of light emitted from the third light source to both light emitted from the first light source and light emitted from the second light source.

8. The LED lighting unit according to claim 3, further comprising:

a first power supply for controlling a driving current to the first light source, a second power supply for controlling a driving current to the second light source and a third power supply for controlling a driving current to the third light source, wherein both the first power supply and the second power supply control a beam ratio of light emitted from the first light source to light emitted from the second light source, and the third power supply controls a beam ratio of light emitted from the third light source to both light emitted from the first light source and light emitted from the second light source.

9. The LED lighting unit according to claim 4, further comprising:

a first power supply for controlling a driving current to the first light source, a second power supply for controlling a driving current to the second light source and a third power supply for controlling a driving current to the third light source, wherein both the first power supply and the second power supply control a beam ratio of light emitted from the first light source to light emitted from the second light source, and the third power supply controls a beam ratio of light emitted from the third light source to both light emitted from the first light source and light emitted from the second light source.

10. The LED lighting unit according to claim 5, further comprising:

a first power supply for controlling a driving current to the first light source, a second power supply for controlling a driving current to the second light source and a third power supply for controlling a driving current to the third light source, wherein both the first power supply and the second power supply control a beam ratio of light emitted from the first light source to light emitted from the second light source, and the third power supply controls a beam ratio of light emitted from the third light source to both light emitted from the first light source and light emitted from the second light source.

11. The LED lighting unit according to claim 1, wherein a mixture of light, including light emitted from the first light source, light emitted from the second light source, and light emitted from the third light source, has a color temperature located substantially on the blackbody locus.

12. The LED lighting unit according to claim 2, wherein a mixture of light, including light emitted from the first light source, light emitted from the second light source, and light emitted from the third light source, has a color temperature located substantially on the blackbody locus.

13. The LED lighting unit according to claim 4, wherein a mixture of light, including light emitted from the first light source, light emitted from the second light source, and light emitted from the third light source, has a color temperature located substantially on the blackbody locus.

14. The LED lighting unit according to claim 6, wherein a mixture of light, including light emitted from the first light source, light emitted from the second light source, and light emitted from the third light source, has a color temperature located substantially on the blackbody locus.

15. The LED lighting unit according to claim 7, wherein a mixture of light, including light emitted from the first light source, light emitted from the second light source, and light emitted from the third light source, has a color temperature located substantially on the blackbody locus.

16. The LED lighting unit according to claim 9, wherein a mixture of light, including light emitted from the first light source, light emitted from the second light source, and light emitted from the third light source, has a color temperature located substantially on the blackbody locus.

17. The LED lighting unit according to claim 1, wherein the phosphor material is a mixture of red phosphor wavelength converting material and green phosphor wavelength converting material, and the second phosphor material is a mixture of red phosphor wavelength converting material and green phosphor wavelength converting material.

18. An LED lighting unit comprising:
a first light source including a blue LED configured to emit blue light and a phosphor configured to wavelength-convert at least a part of the blue light emitted from the blue LED to red wavelength light and green wavelength light, the phosphor configured to emit more red wavelength light than green wavelength light, and the first light source configured to emit light having a color temperature located substantially on a blackbody locus;
a first power supply for controlling a driving current to the first light source;
a second light source including a blue LED configured to emit blue light and a second phosphor material configured to wavelength-convert at least a part of the blue light emitted from the blue LED to red wavelength light and green wavelength light, the second phosphor material configured to emit more green wavelength light than red wavelength light, and the second light source configured to emit light having a higher color temperature substantially on the blackbody locus than a color temperature of light emitted from the first light source;
a second power supply for controlling a driving current to the second light source;
a third light source including a blue LED configured to emit blue light and a third phosphor material configured to wavelength-convert at least a part of the blue light emitted from the blue LED to at least one of a green wavelength light and a yellow wavelength light, and the third light source configured to emit light located within at least one of a green color area and a yellow color area in an xy chromaticity diagram;
a third power supply for controlling a driving current to the third light source; and
a lens located in a direction of light-emission of light emitted from the first light source, the second light source and the third light source, and the lens being configured to control a mixture of the light emitted from each of the first light source, the second light source and the third light source, wherein both the first power supply and the second power supply control a beam ratio of light emitted from the first light source to light emitted from the second light source and locate a mixture light emitted from the first and the second light sources at a position on a virtual line connecting the lights emitted from the first and the second light sources located substantially on the blackbody locus, and the third power supply controls a beam ratio of light emitted from the third light source to the mixture light emitted from the first light source and the second light source and locate the mixture of the light emitted from each of the first, the second and the third light sources at another position on another virtual line connecting the position on the virtual line connecting the lights emitted from the first and the second light sources and the light emitted from the third light source in the xy chromaticity diagram, and wherein the another virtual line intersects the blackbody locus between the lights emitted from the first and the second light sources located substantially on the blackbody locus.

19. The LED lighting unit according to claim 18, wherein the mixture of the light emitted from the first light source, the second light source, and the third light source has a color temperature located substantially on a blackbody locus.

20. The LED lighting unit according to claim 18, wherein both light emitted from the first light source and light emitted from the second light source have color temperatures located substantially on a blackbody locus.

21. The LED lighting unit according to claim 20, wherein a mixture of light emitted from the first light source, the second light source, and the third light source has a color temperature located substantially on a blackbody locus.

22. The LED lighting unit according to claim 18, wherein the phosphor material is a mixture of red phosphor wavelength converting material and green phosphor wavelength converting material, and the second phosphor material is a mixture of red phosphor wavelength converting material and green phosphor wavelength converting material.

* * * * *